United States Patent
Jakubek et al.

(10) Patent No.: US 6,806,033 B2
(45) Date of Patent: Oct. 19, 2004

(54) PHOTOIMAGED DIELECTRIC, ITS MANUFACTURE AND USE IN ELECTRONICS

(75) Inventors: Vladimir Jakubek, Vestal, NY (US); Heike Appelt, Brackney, PA (US); David John Russell, Apalachin, NY (US); Cory J. Ruud, Endicott, NY (US)

(73) Assignee: International Business Machines Corporation, Armonk, NY (US)

( * ) Notice: Subject to any disclaimer, the term of this patent is extended or adjusted under 35 U.S.C. 154(b) by 130 days.

(21) Appl. No.: 10/042,010

(22) Filed: Jan. 8, 2002

(65) Prior Publication Data

US 2003/0165771 A1 Sep. 4, 2003

(51) Int. Cl.[7] .............................. G03F 7/40; G03F 7/038
(52) U.S. Cl. .................... 430/311; 430/280.1; 430/330; 430/325; 522/146; 427/496; 427/504; 427/510; 427/511
(58) Field of Search ................................. 430/330, 325, 430/280.1–331; 427/496, 504, 510, 511; 522/146

(56) References Cited

U.S. PATENT DOCUMENTS

| | | | | |
|---|---|---|---|---|
| 4,593,056 A | | 6/1986 | Qureshi et al. .............. | 523/445 |
| 4,684,420 A | * | 8/1987 | Bryant et al. ................ | 156/116 |
| 4,686,250 A | | 8/1987 | Qureshi ....................... | 523/440 |
| 4,999,740 A | * | 3/1991 | Ilardi et al. .................. | 361/720 |
| 5,061,779 A | | 10/1991 | Wang ........................... | 528/98 |
| 5,278,010 A | * | 1/1994 | Day et al. ..................... | 430/18 |
| 5,278,259 A | | 1/1994 | Futakuchi et al. ........... | 525/482 |
| 5,288,377 A | * | 2/1994 | Johnson et al. ............. | 430/256 |
| 5,536,620 A | * | 7/1996 | Dueber et al. ........... | 430/284.1 |
| 5,584,121 A | | 12/1996 | Arike et al. ................... | 29/850 |
| 5,679,444 A | * | 10/1997 | Davis et al. ................. | 428/209 |
| 5,726,216 A | | 3/1998 | Janke et al. ................... | 522/31 |
| 5,730,764 A | * | 3/1998 | Williamson et al. .......... | 51/295 |
| 6,184,263 B1 | | 2/2001 | Narang et al. ............... | 522/111 |
| 6,528,218 B1 | * | 3/2003 | Foster et al. .................. | 430/14 |

FOREIGN PATENT DOCUMENTS

| | | | | |
|---|---|---|---|---|
| WO | WO 95/14716 | 6/1995 | ............. | C08F/2/46 |

OTHER PUBLICATIONS

Product Bulletin Epon TM REsin 1009F, Resolution Performance Products, RP:3066–01, 4 pages, copyright 2001 and 04/02 date on last page.*

Dupont Electronic Technologies, "THPE–GE–Toxicology summary", 2 pages, no date.*

RN 66072–38–6, Registry, ACS on STN, copyright 2003 one page.*

RN 34590–59–5, Registry, ACS on STN, copyright 2003 one page.*

Fjelstad, Joseph, "Flexible Thinking—Joe Fjelstad", Circuitree, www.circuitree.com, posted Feb. 1, 2002, 3 pages.*

"Fatigue Life" from "Glossary of Materials Testing Terms", Intron at www.instron.com, 4 pages, copyright 2003.*

"Flex Life" from Fisk Alloy Conductor Facts—Flex life at www.fiskalloy.com/c–fact–pages/c–flexlife, 2 pages, no date printed Aug. 6, 2003.*

MIL–P–50884C dated Apr. 9, 1993, retrieved from the Internet, Military Specification; Printed–Wiring, Flexible and Rigid–Flex, 5 pages.*

"IPC-TM–650 Test Methods Manual", No. 2.4.3.1, dated Mar. 1991, The Institute for Interconnecting and Packaging Electronic Circuits, Northbrook, IL, 3 pages.*

* cited by examiner

Primary Examiner—Cynthia Hamilton
(74) Attorney, Agent, or Firm—James A. Lucas; Driggs, Lucas, Brubaker & Hogg Co., LPA

(57) ABSTRACT

Photoimagable polymers, as well as dielectric materials and their manufacture and use in the production of printed circuit boards and printed wiring boards are described. The polymers comprise between about 30 and about 70 parts of a polyfunctional resin and between about 70 and about 30 parts of the condensation product of an epihalohydrin and a bisphenol based on 100 parts by weight of resin. The polymer is cured by a photocationic initiator. It is characterized by a glass transition temperature of at least about 140° C. and a flex fatigue life of at least about 10,000 cycles at a 3% strain. Optionally, less than 10 parts of a third specified epoxy resin may be added to the mixture to improve flexibility without decreasing the glass transition temperature of the polymer.

9 Claims, No Drawings

PHOTOIMAGED DIELECTRIC, ITS MANUFACTURE AND USE IN ELECTRONICS

FIELD OF THE INVENTION

This invention relates to the field of photoimagable dielectric materials and their manufacture. It also relates to the use of such materials in the production of printed circuit boards and printed wiring boards.

BACKGROUND OF THE INVENTION

Current photoimagable dielectric (PID) materials, such as Probimer and Probelec from Vantico, and Dynavia 2000 from Shipley Ronal, have been used in Surface Laminar Circuit™ (SLC) technology as a build-up material. The material is applied to the subcomposite circuit board, and is dried. The vias are then imaged into the dielectric layer, and then the material is cured. Subsequent processing includes a surface treatment, copper plating, and circuitization. This process can be repeated for additional build-up layers, or the substrate can be finished by applying solder mask and the appropriate surface finish.

A common use of SLC technology is in chip carrier substrates. In some applications, specifically those relating to original equipment manufacture, it is desirable to conform to JEDEC standards. One of the JEDEC tests, deep thermal cycling (DTC), subjects the assembled modules to thermal cycling between −55° C. and 125° C. and, in some cases, from −65° C. to 150° C. With certain designs, the PID material may crack during thermal cycling and the crack often propagates through the material causing a break in the underlying electrical circuit line, creating a short or open circuit. This cracking is due to the strain placed on the material by bending of the substrate and by mismatches in the coefficient of thermal expansion (CTE), for example between the copper and the epoxy. Typically, if the localized strain exceeds the ductility of the material, the material will fail. A material may also break by repeated bending at a lower strain, such as during thermal cycling, due to material fatigue. Another factor here is the glass transition temperature (Tg) of the material. This is the temperature at which an amorphous material, such as most polymers, changes from a brittle vitreous state to a plastic state. Since the CTE of polymers typically increases significantly above the Tg, it is desirable to use a material with a Tg higher than the maximum temperature at which the material is stressed.

Typical approaches to solving these problems include adding a thermoplastic component to increase the ductility of the polymer, or adding a filler material to lower the CTE. However, adding a filler can significantly reduce the ductility. In addition, both of these approaches can degrade the photo resolution of the PID.

The resins that are combined to create a polymer formulation will be hereinafter referred to as a "resin blend" This resin blend needs to meet various material and processing objectives for easy manufacture. Also, it is desirable to have a polymer formulation that has high ductility and high flex fatigue life. Furthermore, it is necessary that this polymer system be photoimagable. One approach to formulating a PID material is to use epoxy resins and cationic photoinitiators. There are many epoxy resins available with a range of properties. Cationic photoinitiators suitable for polymerizing epoxies include sulfonium and onium salts and ferrocene derivative salts.

Epoxy starting materials available in the industry may be mono, di, or poly functional. Most epoxy pre polymers are low molecular weight. It is typical for resins synthesized from polymers of low molecular weight epoxy starting materials to be brittle. Some epoxies have a high Tg, but the general trend is for materials with a high Tg to be brittle below the transition temperature. Flexible polymers typically do not have a high Tg. This makes the formulating of such a material with a high Tg, a high ductility, and a low CTE, a challenge.

U.S. Pat. No. 5,061,779 describes the production of a resin capable of filling plated through holes. This resin contains brominated materials and is thermally cured resulting a material having a Tg>75° C. This patent does not teach the production of high Tg and high flex materials for photoimagable applications.

U.S. Pat. Nos. 4,686,250 and 4,593,056 relate to a resin capable of yielding high tensile strength fibers via a wet winding process. The resin in −250 contains cycloaliphatic epoxy and Epon-type resins and aromatic diamine components. The resin in −056 utilizes difunctional epoxy and Epon-like epoxy resins along with an aromatic diamine hardener component. The resin is thermally cured by use of an aromatic trihydroxy cure accelerator. The patents do not teach the production of high Tg and high flex materials for PID applications. Furthermore, these diamines are basic and would tend to neutralize the effect of acidic compounds that are used as cationic photoinitiators.

U.S. Pat. No. 6,184,263 relates to the production of a photoimagable material. This objective is achieved by incorporating a photocationic initiator into a polymeric backbone. Crosslinking is achieved by attaching reactive pendant groups, such as epoxies, acrylates or allyl ethers, to an unrelated polymer backbone.

U.S. Pat. No. 5,278,259 relates to a polymeric resin with good heat resistance and good adhesion to copper, along with good flexibility and high bend strength. The resins can include a blend of difunctional and trifunctional epoxies that are thermally cured using imidazoles.

U.S. Pat. No. 5,584,121 relates to difunctional and trifunctional epoxies that are catalyzed by a photocationic initiator for use as an adhesive. It also includes tin and a polybutadiene toughener. The reported Tg is in the range of 100° to 130° C.

U.S. Pat. No. 5,726,216 describes formulations containing difunctional and trifunctional epoxies along with a thermoplastic toughener, with an object of producing high Tg materials. The formulations are cured utilizing high energy radiation. The use of UV light is not described. The use of the formulations for photoimagable dielectrics is not discussed.

German Pat. No. DE 4217509 discloses a low viscosity mixture of a trifunctional epoxy with a diclycidyl ether based on bisphenol F and a highly functionalized amine-based resin component. The mixture may include silica. It is cured using a thermal catalyst. The mixture is used for prepreg/laminate applications, but is not mentioned as being useful for the photoimagable dielectrics.

BRIEF DESCRIPTION OF THE INVENTION

It is an objective of the present invention to provide a photoimagable polymer having a high glass transition temperature along with good flexibility.

Another objective is the use of a photoimagable polymer as a surface layer on an electronic substrate wherein the polymer has a high Tg and high flexibility.

These and other objectives that will become apparent are achieved in accordance with the following discussion.

The present invention relates to a polymer consisting of a mixture of a polyfunctional epoxy resin and the condensation product of a bisphenol and an epihalohydrin. The polymer is cured by a photocationic initiator, such as a sulfonium compound. The polymer is characterized by a glass transition temperature of at least about 140° C., preferably about 150° C. or above and a flex fatigue life of at least about 10,000 cycles measured at a 3% strain. The polyfunctional epoxy resin typically comprises the triglycidyl ether of tris (hydroxy phenyl) while the condensation product of the bisphenol and epihalohydrin comprises a diglycidyl ether of bisphenol A (abbreviated as DGEBPA). Up to about 10% of a third selected resin may be added to further improve the flexibility of the polymer without lowering the glass transition temperature. The process of making the polymer comprises the steps of: a) preparing a resin mixture of a polyfunctional epoxy resin and the condensation product of a bisphenol and an epihalohydrin; b) incorporating an effective amount of a cationic photoinitiator into the resin mixture, c) exposing the resin mixture to a source of actinic radiation, and d) further processing the resin mixture using heat or other means to crosslink the resin mixture.

The use of masks to selectively expose the resin mixture to radiation is contemplated. This can then be followed by a heating step to achieve the crosslinking. The imageable material can be developed according to known procedures to remove any uncrosslinked material in areas that are not exposed to the radiation after which the curing of the polymer is completed by exposure to a second dose of actinic radiation and a second heating step. The use of a laser instead of masks can be used to selectively expose certain predefined portions of the material. These portions are then cured or crosslinked as by heating or the like.

The invention also relates to a photoimagable dielectric material having high flex fatigue resistance and a high glass transition temperature above about 140° C. The material typically comprises a resin mixture of: a) a polyfunctional epoxy resin having at least two and preferably three epoxy groups, and b) the condensation product of bisphenol A and an epihalohydrin. The blend is cured by an effective amount of a cationic photoinitiator, preferably a sulfonium compound. The polyfunctional epoxy resin can comprise the triglycidyl ether of tris(hydroxy phenyl) and the condensation product of the bisphenol and the epihalohydrin can comprise a diglycidyl ether of bisphenol A. Up to about 10% of a third selected resin may be added to further improve the flexibility of the polymer without lowering the glass transition temperature. The third resin is an epoxy resin may be an epoxidied phenolformaldehyde novolac having a functionality of about 2.4 and a weight per epoxide between about 172 and about 179 or a diglycidyl ether of bisphenol A having a weight per epoxide between about 600 and about 950. Films made from the dielectric polymer are also covered.

The invention also covers a process of making and using a photoimagable dielectric. The process comprises the steps of: a) preparing a resin mixture of a polyfunctional epoxy resin having at least two and preferably three epoxy groups and the condensation product of a bisphenol A and an epihalohydrin, said polymer cured by a photocationic initiator such as a sulfonium compound; b) incorporating an effective amount of a cationic photoinitiator into the resin mixture, c) exposing the resin mixture to a source of actinic radiation, and d) using heat or other means to crosslink the resin mixture to polymerize the same. The exposure and curing can be done in two separate steps with an intermediate step of developing the material to remove any uncrosslinked material in any areas that were not exposed. The polyfunctional epoxy resin may comprise the triglycidyl ether of tris(hydroxy phenyl) and the condensation product of the bisphenol and epihalohydrin may comprise a diglycidyl ether of a bisphenol A. Up to about 10% of a third selected resin may be added to further improve the flexibility of the polymer. The third resin may be an epoxidied phenolformaldehyde novolac having a functionality of about 2.4 and a weight per epoxide between about 172 and about 179 or a diglycidyl ether of bisphenol A having a weight per epoxide between about 600 and about 950. The mixture is applied to an electronic substrate to form a layer thereupon. Thereafter, the layer or a pattern thereon is exposed to a source of actinic radiation to cure the polymer.

DETAILED DESCRIPTION OF THE INVENTION

The present invention relates to a polymer useful as a layer or coating on top of an electronic substrate, such as a printed circuit board or module. The polymer is prepared from a blend of a first component comprising an epoxy resin that is solid at room temperature and a second component comprising a polyfunctional epoxy resin having more than two, and preferably at least three, epoxy groups. A cationic photopolymerization initiator is incorporated into the blend in an amount that is effective to cause curing of the polymer blend.

The solid epoxy resin preferably is a bisphenol A type epoxy resin. It is used in the range of between 30 and about 70 parts by weight based on the total weight of the resin components. This will be hereafter referred to as PHR (parts by weight per one hundred parts of resin) for the sake of simplicity. When used in this range, the bisphenol resin helps to obtain a coating layer on the substrate having a uniform film thickness. When used in amounts below about 30 parts, the flexibility of the film is reduced. When used above 70 parts, the glass transition temperature Tg is lowered, resulting in an undesirable reduction in the mechanical performance of the film as well as its heat resistance. The bisphenol A resin typically has a low molecular weight and a weight per epoxide between about 2300 and about 3800. One resin suitable for this purpose is EPON 1009F formerly available from Shell Chemical Company and now marketed by Resolution Performance Polymers.

The second component is a polyfunctional epoxy resin having more than two epoxy groups which can serve as crosslinking points, thereby providing the capability of forming a three dimensional lattice and a cured polymer having a high crosslink density. Since the polyfunctional resin is chemically compatible with the bisphenol resin, uniform mixtures of the two are easily obtained. The polyfunctional resin is used in an amount of between about 30 parts and about 70 parts by weight per 100 parts of total resin. Amounts below 30 parts do not result in any significant improvement in crosslink density. Above 70 parts, the resin loses flexibility. One resin that has been found to be particularly suitable for this purpose is Tactix 742 formerly available from Ciba Specialty Chemicals (now marketed by Vantico, Inc). This is a trihydroxy triphenylmethane trisglycidyl ether.

To the two component system may be added a small amount of up to about 10 PHR of a third component. It may be similar in structure to the first component, but with a lower epoxy equivalent than that of the EPON 1009F. Yet it serves to provide additional flexibility to the polymer without causing a reduction of the flex fatigue life of the polymer. Examples are EPON 1002F and EPON 1004F marketed by Resolution Performance Polymers. They have a weight per epoxide of between about 600 and about 950. Another product that has been found to be suitable for this purpose is Aratronic 5057, an epoxidized phenolformaldehyde novolac marketed by Vantico, Inc. This epoxy resin has a functionality of about 2.4 and a weight per epoxide of between about 172 and about 179.

The cationic photopolymerization initiator preferably is a sulfonium salt, such as an aromatic sulfonium salt available as Cyracure UVI-6950, UVI-6970, UVI-6974, and UVI-6990 sold by Union Carbide Co.; Degacure KI 85 sold by Degussa; FC 508 and 512 sold by 3M Company; SarCat CD-1010, CD-1011 and KI-85 sold by Sartomer; UVI 1014 and UVI 1016 sold by GE Company; SP-55, SP-150 and SP-170 sold by Asahi Denka Kogyo K.K. The initiator is used in an amount of between about 0.5 and about 15 parts by weight, preferably between about 0.5 and about 5 parts, per 100 parts of the total resin mixture. Amounts below 0.5 cause the curing to proceed with difficulty and too slowly. The use of amounts above about 15 parts does not improve photospeed and thus is uneconomical. Another family of compounds that can be used for curing of the resin system comprises iodonium salts. Examples of these are Rhodorsil 2074 sold by Rhone-Poulenc Co. and SarCat CD-1012 sold by Sartomer. Yet another photoinitiator useful in the teachings of the present invention is a ferrocenium-type salt such as Irgacure 261 sold by Ciba-Geigy.

A controlled amount of a substance, such as silica or a polyamide powder, may be added to the resin blend as a filler, or to control the flow properties of the coating. Examples of a suitable silica is a powder having a medium diameter of 3.5 μm, and a maximum diameter of 12 μm. A suitable polyamide product is Orgasol 2001 UD NAT sold by Elf Atochem. Because of the tendency of the filler to reduce the photoimagability and the flexibility of the polymer, typically less than 5 parts per 100 PHR are used in the resin mixture.

The epoxy compounds provide very good adhesion of the resultant polymer to base materials. A particularly useful epoxy is one having at least one, and preferably at least two, epoxy groups per molecule, and a high molecular weight of at least about 1,600 g/mole. These epoxy compounds are commonly prepared by the reaction of a polyhydric phenol with an epihalohydrin, such as epichlorohydrin, in the presence of an inorganic base. The epoxy compound typically is present in the resin composition in an amount of between about 30 parts and about 70 parts by weight of the resin mixture. More preferably, it is present in an amount of between about 40 parts and about 60 parts by weight. Epoxy constituents include epoxy resins which contain one or more epoxy groups having the following formula:

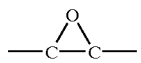

The epoxy groups can be terminal epoxy groups or internal epoxy groups. The epoxides are of two general types: polyglycidyl compounds, or products derived from epoxidation of dienes or polyenes. Polyglycidyl compounds contain a plurality of 1,2-epoxide groups derived from the reaction of a polyfunctional active hydrogen containing compound with an excess of an epihalohydrin under basic conditions. When the active hydrogen compound is a polyhydric alcohol or phenol, the resulting epoxide resin contains glycidyl ether groups. A preferred group of polyglycidyl compounds are made via condensation reactions with 2,2-bis(4-hydroxyphenyl) propane, also known as bisphenol A, and have structures such as

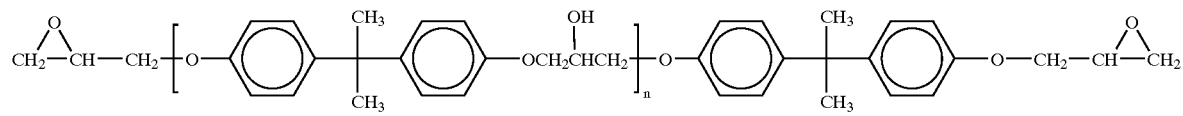

where n has a value from about 0 to about 15. These epoxides are condensation products of bisphenol A and epichlorohydrin. Other bisphenols, such as bisphenol F, may be used in place of the bisphenol A.

As previously mentioned, the two component or three component resin mixture is processed in such a manner as to form a fully cured or crosslinked pattern by exposure to actinic radiation and one or more heating steps. Basically, the process involves exposing at least a portion of a layer of the resin mixture to a source of actinic radiation. If less than all of the layer is to be cured, a mask may be used to form a pattern on the surface of the layer. The actinic radiation is then used to expose only the portion or portions to be exposed. As an alternative to a mask and actinic radiation, a laser beam may be used to activate the photoinitiator in a predetermined pattern in the layer. The layer is then subjected to heat to at least partially cure the exposed material. Thereafter, the unexposed material can be removed by suitable means well known in the art. The partially cured mixture is then exposed to radiation a second time. The final step comprises again heating the layer to fully cure the partially cured mixture.

EXAMPLES

A large number of different resin blends are formulated into polymers which are then measured for Tg and flex fatigue. Each of the polymers contains at least one epoxy compound blended with a second epoxy compound and/or a thermoplastic component. Some of the blends contain a filler, such as silica or a polyamide powder. Many formulations are evaluated for Tg, CTE, and flex fatigue life at room temperature. The polymers are based on commercially available epoxy resins advertised as having a high impact resistance, or as being flexible. The resin blends are prepared with a cationic photoinitiator according to the following procedure:

Combine measured amounts of the resin components into small plastic vessel.

Add solvent and place the mixture on a mechanical stirrer or roller mill apparatus.

Once the resins are dissolved (12–24 hr), the photoinitiator is added and the mixture is stirred for an additional hour.

Thin films (40–60 μm) are prepared on aluminum foil via drawdown technique using a wound wire rod or doctor blading.

The films are air dried for 30 min, and then oven dried @125° C. for 10 min.

The samples are then exposed to UV irradiation to initiate crosslinking.

The samples then undergo a post-expose bake @165° C. for 60 min.

The samples are tested for Tg and CTE by thermal mechanical analysis (TMA) whereby each sample is heated and the thermal expansion of the material is measured during heating. The coefficient of thermal expansion (CTE) of most polymeric materials increases significantly when the material is heated above the glass transition temperature). The resultant curve is then analyzed to determine both the Tg and the CTE. The Tg measurement is typically accurate to about ±2° C.

The flex fatigue life of the samples is measured, according to the following procedure:

Several ⅛" width strips are cut from the above samples.

The aluminum foil backing is peeled away, and ~1" length samples are cut.

The ends of the samples are taped to 10"×½" paper strips and loaded on a flex fatigue tester, such as a Model 2FDF Fatigue Ductility Flex Tester available from Jovil/Universal Manufacturing Company in Danbury, Conn. Each sample is formed into a loop and is positioned around a mandrel having a specific diameter. For these tests, three mandrels having diameters of 24, 48 and 72 mils are used. A small weight is attached to the paper loop to provide tension on the sample.

A rotating motor cam provides an oscillating movement to the mandrels, and the number of cycles are counted until sample failure.

The resulting number of cycles to fail is normalized to a 3% strain.

The resin components used in each polymer shown in Table 1, along with its chemical type and suppliers are listed in Table 1. The results of these tests on 60 different polymer formulations are shown in the following Table 2.

TABLE 1

| COMPONENT | CHEMICAL TYPE | MANUFACTURER |
| --- | --- | --- |
| Apec | polycarbonate | Bayer Chemical Co. |
| Aratronic | Epoxidzed phenol-formaldehyde novolac | Vantico, Inc |
| DER 732 | Polyglycol diepoxide | Dow Plastics |
| EPON 1002E | DGEBPA | Resolution Performance Polymers |
| EPON 1004F | DGEBPA | Resolution Performance Polymers |
| EPON 1009F | DGEBPA | Resolution Performance Polymers |
| EPON 164 | epoxidized ortho cresol novalac | Resolution Performance Polymers |
| EPON 828 | DGEBPA | Resolution Performance Polymers |
| EPON SU-8 | octafunctional BPA | Resolution Performance Polymers |
| Heloxy 61 | butyl GE | Resolution Performance Polymers |
| Heloxy 62 | o-cresyl GE | Resolution Performance Polymers |
| Heloxy 71 | Dimer acid di-glycudyl ester | Resolution Performance Polymers |
| PKHC | phenoxy | Phenoxy Assoc. Inc. |
| Poly bd 600 | Polybutadiene, hydroxyl terminated | Atofina, formerly Elf Atochem |
| Poly bd 605 | Polybutadiene, hydroxyl terminated | Atofina |
| Tactix 742 | Trihydroxy Triphenylmethane TGE | Vantico, Inc |
| Araldite XB4122 | BPA based/ether links/difunctional | Vantico, Inc |
| Silica | Fumed silica | Degussa Corp. |
| Orgasol 2001 UD NAT | Polyamide | Atofina |
| PLV-4 | amorphous silica | Tasumorui Ltd |
| USV-5 | Amorphous silica | Tasumorui Ltd |

TABLE 2

LIST OF VARIOUS FORMULATIONS AND THEIR PHYSICAL PARAMETERS

| Formulation No. | | 1 | 2 | 3 | 4 | 5 | 6 | 7 | 8 | 9 | 10 | 11 | 12 | 13 | 14 | 15 | 16 | 17 | 18 | 19 | 20 |
|---|---|---|---|---|---|---|---|---|---|---|---|---|---|---|---|---|---|---|---|---|---|
| Apec | | 15 | 36 | 36 | | 8 | 15 | 30 | 15 | | | | | | | | | | | | |
| Orgasol | | | | | | | | | | 30 | 45 | 60 | | | | | | | | | |
| PLV-4 | | | | | | | | | | | 6 | | | | | | | | | | |
| Silica | Filler | | | | 13 | | | | | | | | | | | | | | | | |
| USV-5 | | | | | | | | | | | | | | | | | | | | | 30 |
| Tactix 742 | | | | | | 33 | 33 | 33 | | | | | 28 | 38 | 60 | | | | | | 30 |
| EPON 1009F | | | | | | 33 | 33 | 33 | 50 | 50 | 50 | 50 | 50 | 50 | 50 | | | | | | 30 |
| EPON 1002F | | | | | | 33 | 33 | 33 | 50 | 50 | 50 | 50 | 50 | 50 | 50 | | | | | | |
| Araldite XB4122 | | | | | | | 33 | 33 | | | | | | | | | | | | | |
| Aratronic 5057 | | | | | | | 33 | 33 | | | | | | | | | | | | | |
| DER 732 | | | | | | | | | | | | | | | | | | | | | |
| EPON 164 | | 20 | | | | | | | | | | | | | | | | | | | |
| EPON 828 | | | | | | | | | | | | | | | | | | | | | |
| EPON 872 | | | | | | | | | | | | | | | | | | | | | |
| EPON 1002F | | | | | | | | | | | | | | | | 65 | 54 | | | | |
| EPON 1004F | | | | | | | | | | | | | | | | | 10 | 85 | | | |
| EPON SU-8 | | 65 | | 64 | | | | | | | | | | | | | | | | | |
| Heloxy 61 | | | | | 88 | | | | | | | | | | | | | | | | |
| Heloxy 62 | | | | | | | | | | | | | | | | | | | 30 | 20 | |
| Heloxy 71 | | | | | | | | | | | | | | | | | | | 70 | 80 | |
| PBD 600 | | | | | | | | | | | | | | | | | | | | | |
| PBD 605 | | | | | | | | | | | | | | | | | | | | | |
| PKHC | | | | | | | | | | | | | | | | | | | | | |
| Filler | 100% | 15 | 36 | 42 | 12 | 8 | 15 | 30 | 15 | 30 | 45 | 60 | 28 | 38 | 60 | 35 | 36 | 15 | 30 | 20 | 33 |
| 1-st Component | | 24 | 100 | 100 | 13 | 33 | 33 | 33 | 50 | 50 | 50 | 50 | 50 | 50 | 50 | 65 | 54 | 85 | 70 | 80 | 33 |
| 2-nd Component | | 76 | | | 88 | 33 | 33 | 33 | 50 | 50 | 50 | 50 | 50 | 50 | 50 | 35 | 36 | 15 | | | 33 |
| 3-rd Component | | | | | 12 | 33 | 33 | 33 | | | | | | | | | 10 | | | | |
| NOTES: | | 1, 3 | 1, 3 | 3 | 3 | 2, 3 | 3 | 3 | 4, 5 | 3, 5 | 3, 5 | 3, 6, 7 | 3 | 3 | 3, 7 | 3 | 3 | 3 | | | 3 |
| Tg (TMA), °C. | | 131 | 148 | 195 | 300 | 194 | 196 | 195 | 160 | 155 | 148 | 158 | 164 | 168 | 149 | 106 | 108 | 203 | 198 | 160 | 99 |
| CTE < Tg, ppm/°C. | | 70 | 78 | 71 | 62 | 90 | 82 | 130 | 64 | 56 | 51 | 42 | 55 | 49 | 33 | 75 | 77 | 69 | 72 | 69 | 84 |
| Cycles to Fail | | 1000 | 3000 | 4000 | 1 | 25 | 12 | 166 | 240 | 200 | 150 | 2 | 190 | 30 | 2 | 9000 | 4000 | 1 | | | 800 |
| % Strain | | | | | | 3.8 | 4.1 | 4.3 | 3.0 | 3.0 | 3.0 | 3.0 | 3.0 | 3.2 | 3.0 | | | | | | |
| Film thickness, um | | | | | | 79 | 84 | 90 | | | | | | | | | | | | | |
| Photospeed, mJ | | | | | | | | | 34.3 | 155.3 | 253.8 | <900 | | | | | | | | | |
| Resolution, um | | | | | | | | | 4.2 | 7.4 | 7.8 | <87 | | | | | | | | | |
| Step wedge | | | | | | | | | | | | <3.2 | | | | | | | | | |

| Formulation No. | | 21 | 22 | 23 | 24 | 25 | 26 | 27 | 28 | 29 | 30 | 31 | 32 | 33 | 34 | 35 | 36 | 37 | 38 | 39 | 40 |
|---|---|---|---|---|---|---|---|---|---|---|---|---|---|---|---|---|---|---|---|---|---|
| Apec | | | | | | | | | | | | | | | | | | | | | |
| Orgasol | | | | | | | | | | | | | | | | | | | | | |
| PLV-4 | | | | | | | | | | | | | | | | | | | | | |
| Silica | Filler | | | | | | | | | | | | | | | | | | | | |
| USV-5 | | | | | | | | | | | | | | | | | | | | | |
| Tactix 742 | | 30 | 33 | 70 | 70 | 50 | 50 | 30 | 40 | 50 | 50 | 55 | 60 | 70 | 50 | 50 | 50 | 50 | 50 | 50 | 50 |
| EPON 1009F | | 30 | 15 | 15 | | | | 70 | 60 | 50 | 50 | 45 | 40 | 30 | 50 | 50 | 50 | 50 | 50 | 50 | 50 |
| Araldite XB4122 | | | | | | | | | | | | | | | | | | | | | |
| Aratronic 5057 | | | | | | | | | | | | | | | | | | | | | |

TABLE 2-continued

LIST OF VARIOUS FORMULATIONS AND THEIR PHYSICAL PARAMETERS

| Formulation No. | 41 | 42 | 43 | 44 | 45 | 46 | 47 | 48 | 49 | 50 | 51 | 52 | 53 | 54 | 55 | 56 | 57 | 58 | 59 | 60 |
|---|---|---|---|---|---|---|---|---|---|---|---|---|---|---|---|---|---|---|---|---|
| DER 732 | | | | | | | | | | | | | | | | | | | | |
| EPON 164 | | | | | | | | | | | | | | | | | | | | |
| EPON 828 | 30 | 33 | | | | | | | | | | | | | | | | | | |
| EPON 872 | | | | | | | | | | | | | | | | | | | | |
| EPON 1002F | | | | | | | | | | | | | | | | | | | | |
| EPON 1004F | | 34 | | 15 | 50 | | | | | | | | | | | | | | | |
| EPON SU-8 | | | | | | | | | | | | | | | | | | | | |
| Heloxy 61 | | | | | | | | | | | | | | | | | | | | |
| Heloxy 62 | | | 15 | | | | | | | | | | | | | | | | | |
| Heloxy 71 | | | | 15 | | | | | | | | | | | | | | | | |
| PBD 600 | | | | | | | | | | | | | | | 1 | | | | | |
| PBD 605 | | | | | | | | | | | | | | 1 | | 4 | 1 | 2 | 4 | 10 |
| PKHC | | | | | | | | | | | | | | | 3 | | | | | |
| Filler 100% | 33 | 33 | 70 | 70 | 50 | 50 | 30 | 40 | 50 | 50 | 55 | 60 | 70 | 50 | 49 | 48 | 50 | 49 | 48 | 45 |
| 1-st Component | 33 | 33 | 15 | 15 | 50 | 50 | 70 | 60 | 50 | 50 | 45 | 40 | 30 | 50 | 49 | 48 | 50 | 49 | 48 | 45 |
| 2-nd Component | 33 | 34 | 15 | 15 | | | | | | 8 | 5 | | | 1 | 3 | 4 | 1 | 2 | 4 | 9 |
| 3-rd Component | | | | 3 | | | | | | | | | | 5 | 5 | 4 | 5 | 5 | 5 | 5 |
| NOTES: | | | | | | | | | | | | | | | | | | | | |
| Tg (TMA), °C. | 2, 3 | 2, 3 | 1 | 3 | 3, 6 | 3 | 4, 5 | 3, 5 | 4, 6 | 73 | 5 | 3, 5 | 3, 5 | 163 | 159 | 163 | 160 | 164 | 165 | 149 |
| | 167 | | | | 202 | 204 | 139 | 162 | 166 | 87 | 175 | 187 | 200 | 75 | 77 | 75 | 75 | 75 | 76 | 83 |
| CTE < Tg, ppm/°C. | 81 | | | | 77 | 76 | 68 | 72 | 73 | | 73 | 70 | 70 | | | | | | | |
| Cycles to Fail | 2000 | 2 | | | 50 | 2500 | 32950 | 24008 | 12072 | | | 3236 | 7088 | | | | | | | |
| % Strain | | | | | 2.3 | 2.2 | 3.0 | 2.7 | 3.0 | | | 3.4 | 2.5 | | | | | | | |
| Film thickness, um | | | | | 47 | 45 | 61 | 55 | 61 | | | 70 | 50 | | | | | | | |
| | | | | | 600 | | | | 2300 | | | | | | | | | | | |
| Photospeed, mJ | 34.0 | | | | 34.0 | | 27.5 | 34.3 | 34.3 | | 34.3 | 39.0 | 39.0 | 34.3 | 49.3 | | 39.0 | | 34.3 | 62.3 |
| Resolution, um | 2.5 | | | | 2.5 | | 3.5 | 3.5 | 3.6 | | 2.6 | 4.9 | 6.0 | 5.8 | 7.0 | | 5.6 | | 5.0 | 6.1 |
| Step wedge | | | | | | | | | | | | | | | | | | | | |
| Apec | | | | | | | | | | | | | | | | | | | | |
| Orgasol | 50 | 50 | | | 50 | 50 | 50 | 50 | 50 | 50 | 50 | 50 | 50 | 50 | 50 | 50 | 50 | 50 | 50 | 50 |
| PLV-4 | 50 | 50 | | | 50 | 50 | 50 | 50 | 50 | 50 | 50 | 50 | 50 | 50 | 50 | 50 | 50 | 50 | 50 | 50 |
| Silica | | | | | | | | | | | | | | | | | | | | |
| USV-5 | | | | | | | | | | | | | | | | | | | | |
| Tactix 742 | | | | | | | | | | | | | | | | | | | | |
| EPON 1009F | | | | | | | | | | | | | | | | | | | | |
| Araldite XB4122 | | | | | | | 10 | 30 | 10 | | 30 | | | | | 30 | | | | |
| Aratronic 5057 | | | | | | 1 | | | | 20 | | | | | | | | | | |
| DER 732 | | | | | | | | | | 30 | | | | | | | | | | |
| EPON 164 | | | | | | | | | | | | | | | 10 | | | | | |
| EPON 828 | | | | | | | | | | | | | | | | | 10 | | | |
| EPON 872 | | | | | | | | | | | | | | | | | | | | |
| EPON 1002F | | | | | | | | | | | | | | | | | 30 | 10 | 20 | 30 |
| EPON 1004F | | | | | | | | | | | | | | | | | | | | |
| EPON SU-8 | | | 1 | 10 | | | | | | | | | | | | | 50 | 40 | 30 | 20 |
| Heloxy 61 | | | | | 30 | | | | | | | | | | | | | | | |

TABLE 2-continued

LIST OF VARIOUS FORMULATIONS AND THEIR PHYSICAL PARAMETERS

| | | | | | | | | | | | | 10 | 20 | 30 | | | | | |
|---|---|---|---|---|---|---|---|---|---|---|---|---|---|---|---|---|---|---|---|
| Heloxy 62 | | 20 | | | | | | | | | | | | | | | | | |
| Heloxy 71 | | | 30 | | | | | | | | | | | | | | | | |
| PBD 600 | | | | | | | | | | | | | | | | | | | |
| PBD 605 | | | | | | | | | | | | | | | | | | | |
| PKHC | 100% | | | | | | | | | | | | | | | | | | |
| 1-st Component | | 42 | 50 | 45 | 38 | 50 | 45 | 38 | 45 | 42 | 38 | 45 | 42 | 38 | 45 | 42 | 38 | 50 | 50 | 50 |
| 2-nd Component | | 42 | 50 | 45 | 38 | 50 | 45 | 38 | 45 | 42 | 38 | 45 | 42 | 38 | 45 | 42 | 38 | 40 | 30 | 20 |
| 3-rd Component | | 17 | 1 | 9 | 23 | 1 | 9 | 23 | 9 | 17 | 23 | 9 | 17 | 23 | 9 | 17 | 23 | 10 | 20 | 30 |
| NOTES: | | 5 | 4, 5 | 4, 5 | 4, 5 | 4, 5 | 4, 5 | 4, 5 | | | | 4, 5 | 4, 5 | 4, 5 | 4, 5 | 4, 5 | 5 | 4 | |
| Tg (TMA), °C | | 142 | 175 | 168 | 181 | 164 | 169 | 169 | 166 | 175 | 170 | 160 | 168 | 162 | 169 | 166 | 153 | 160 | 166 | 181 |
| CTE < Tg, ppm/°C | | 83 | 76 | 71 | 68 | 71 | 71 | 74 | 74 | 76 | 74 | 74 | 73 | 74 | 68 | 78 | 77 | 75 | 75 | 75 |
| Cycles to Fail | | | 1467 | 274 | 637 | 14354 | 2407 | 1835 | | | | 25327 | 3722 | 3387 | | | | | | |
| % Strain | | | 3.0 | 3.0 | 3.0 | 3.0 | 3.0 | 3.0 | | | | 3.0 | 3.0 | 3.0 | | | | 3.0 | | |
| Film thickness, um | | | 61 | 61 | 61 | 61 | 61 | 61 | | | | 61 | 61 | 61 | | | | 61 | | |
| Photospeed, mJ | | 78.8 | 49.3 | 22.3 | 34.3 | 31.5 | 34.3 | 54.8 | | | | 31.5 | 27.5 | 34.3 | | | | 31.5 | | |
| Resolution, um | | | | | | | | | | | | | | | | | | | | |
| Step wedge | | 6.3 | 5.6 | 5.0 | 4.7 | 5.5 | 7.0 | 7.7 | | | | 4.2 | 3.5 | 2.0 | | | | 4.0 | | |

Notes:
1. Massive phase separation,
2. Slight phase separation,
3. Cycles to fail at one mandrel size,
4. Cycles to fail at 3.0% strain from Cycles to fail vs. % Strain curve,
5. Energy of irradiation is ≧300 mJ,
6. Optimal Energy of irradiation,
7. Very brittle,
8. Thermally cured with 0.13% of 2-methyl imidazol Table 2 is a listing of the components used in each polymer formulation shown in table 1 along with the name of the supplier and the published information about the component.

The photospeed and optical density of some of the samples are also determined as shown in Table 2. Each film is a negative-acting material so that when it is exposed to actinic radiation, the portion exposed to the radiation will polymerize, while any portion that is protected therefrom by a mask will remain uncrosslinked. A developer solution is then used to dissolve any unpolymerized or uncrosslinked material. The photospeed is a measure of the amount of light energy needed to polymerize the exposed areas such that they become insoluble in the developer. This light energy is measured in milli Joules, with the objective to obtain as low a value as possible.

The step wedge is a test device that provides graduated areas of increasing optical density. A sample of film is put over the wedge and is given a single light exposure dose. The resultant number is an indication of the photospeed, with a higher number being better than a lower number. In a 21 step wedge used on several of the samples in Table 1, every two steps represents a doubling of the photospeed.

Certain general trends are noted. Formulations with a higher Tg tended to be brittle, and those with lower Tg values were more ductile. Most formulations have a flex fatigue life of less than 10,000 cycles at a 3% strain. They have Tg values ranging from 106° C. to about 200° C. In addition, the CTE of most epoxy formulations are in the 60–80 ppm/deg. C. range without a filler added. Formulations numbered 27–29, 46 and 55 fall within the parameters of the present invention, having a Tg of about 140° C. or more and a flex fatigue life of at least 10,000 cycles.

Example 29 shows one formulation in particular that has been found to give good results. This is a 1:1 blend of Tactix 742 trifunctional epoxy from Vantico, Inc and Epon 1009 from Resolution Performance Polymers. The blend includes 3 PHR of a cationic photoinitiator. The resin system is prepared by dissolving the solid or semi-solid resins in a solvent accompanied by mechanical stirring. The solution is then formed into films by solution casting and the film is cured according to process previously described. The polymer blend produces a film with a flex fatigue life of 12072 cycles to fail at 3% strain. Furthermore, the Tg of the formulation is determined to be 166° C. The combination of a high Tg and a high flex fatigue life is a novel and unexpected result. With the addition of 1 PHR of Aratronic 5057 to the blend, as shown in Example 46, the flex life of the polymer is increased to 14354 cycles with no sacrifice in Tg. When 9 PHR of EPON 1004F is added to 45 PHR of Tactix 742 and 45 PHR of EPON 1009F as shown in Example 55 the fatigue life is increased to 25327 cycles and, unexpectedly, the Tg is increased to 169° C. The highest flex fatigue life is obtained by Example 27 (a blend of 30 parts of Tactix 742 and 70 parts of EPON 1009F, even though the Tg is slightly lower than that of some of the other polymers deemed to be satisfactory.

Since formulations are often adjusted for processability, some sacrifice of the flex life is possible. With the desired properties achieved by this formulation, there is latitude to add fillers, modify the formulation, and manipulate the process variables for the new PID formulation.

In summary, what is disclosed here is a base formulation for a high flex fatigue resistant PID material. It is based on a blend of a polyfunctional epoxy and a difunctional epoxy using a sulfonium salt cationic photoinitiator. The formulation produces polymers having a flex fatigue life of at least 10,000 cycles to fail at 3% strain as opposed to prior art polymers that fail before reaching about 10,000 cycles when subjected to the same strain.

The polymers of the present invention can include small amounts of other components, such as fillers and certain brominated materials. Fillers, such as silica, may be added to the polymer solution to lower the coefficient of thermal expansion. However, this improvement must be balanced against the tendency of the filler to also reduce the flex life of the polymer. Certain brominated materials, such as those described in U.S. Pat. No. 5,061,779, may be added for the purpose of imparting flame retardancy to the polymer.

The specific details of construction of printed circuit boards and their operation are known to persons of ordinary skill in the art. Accordingly, these details do not comprise a part of the present invention, except to the extent that they and their operation have been modified or improved by the teachings of the present invention.

While the invention has been described in combination with embodiments thereof, it is evident that many alternatives, modifications, and variations will be apparent to those skilled in the art in light of the foregoing teachings. Accordingly, the invention is intended to embrace all such alternatives, modifications and variations as fall within the spirit and scope of the appended claims.

What is claimed is:

1. The process of making a photoimaged dielectric having a glass transition temperature of at least about 140° C., comprising the steps of
   a) preparing a resin mixture of a polyfunctional epoxy resin comprising triglycidyl ether of tris (hydroxy phenyl), and the condensation product of the bisphenol and epihalohydrin comprising a diglycidyl ether of a bisphenol A,
   b) incorporating into the mixture up to 10 PHR of a third epoxy resin capable of improving the flex fatigue life of the dielectric without lowering the glass transition temperature of the dielectric below about 140° C.,
   c) incorporating an effective amount of a curing agent comprising a cationic photoinitiator into the mixture,
   d) exposing at least a portion of the mixture to a source of actinic radiation, and
   e) further processing the resin mixture to crosslink the exposed portion of the resin mixture.

2. The process according to claim 1 wherein the cationic photoinitiator is a sulfonium compound, and is used in the mixture in an amount of between about 0.5 and about 15 PHR.

3. The process according to claim 1 wherein the third epoxy resin is selected from the group consisting of an epoxidized phenolformaldehyde novolac having a weight per epoxide between about 172 and about 179 and a diglycidyl ether of bisphenol A having a weight per epoxide between about 600 and about 950.

4. The process according to claim 1 wherein the at least a portion of the resin mixture is exposed to actinic radiation through a pattern.

5. The process according to claim 4 wherein the resin mixture is further processed in step e) by 1) subjecting the mixture to heat to at least partially cure the exposed portion of the material, 2) removing unexposed material, 3) exposing the partially cured mixture to actinic radiation a second time, and 4) heating to fully cure the mixture to form a polymer.

6. The process of using a photoimagable polymer capable of forming a film having a glass transition temperature of at least about 140° C., comprising:

a) preparing a resin mixture of a polyfunctional epoxy resin having more than two epoxy groups and comprising the triglycidyl ether of tris (hydroxy phenyl) and the condensation product of a bisphenol and an epihalohydrin comprising a diglycidyl ether of a bisphenol A, wherein the polyfunctional epoxy comprises between about 30 parts and about 70 parts by weight per 100 parts of the resin mixture, and the condensation product comprises between about 70 parts and about 30 parts by weight per 100 parts of the resin mixture, b) incorporating a cationic photoinitiator into the mixture effective to at least partially cure the mixture upon exposure to actinic radiation, c) applying the mixture to an electronic substrate to form a layer thereupon, and d) exposing the at least a portion of the layer to a source of actinic radiation to at least partially cure the polymer.

7. The process according to claim 6 wherein the cationic photoinitiator is selected from the group consisting of a sulfonium compound, an iodonium compound and a ferrocenium-type compound.

8. The process of making a photoimaged dielectric having a flex fatigue life of at least about 10,000 cycles at about a 3% strain, a Tg of at least about 140° C., and a coefficient of thermal expansion below the glass transition temperature between about 60 and about 80 ppm/° C., comprising the steps of a) based on 100 parts by weight of a resin mixture, preparing a mixture of between about 30 parts and about 70 parts of a polyfunctional epoxy resin comprising the triglycidyl ether of tris (hydroxy phenyl) and between about 70 parts and about 30 of a diglycidyl ether of bisphenol A and optionally including the addition to the resin mixture of up to 10 parts of a third epoxy resin capable of improving the flex fatigue life of the polymer without lowering the glass transition temperature below about 140° C. wherein the third epoxy resin is selected from the group consisting of an epoxidized phenolformaldehyde novolac having a weight per epoxide between about 172 and about 179 and a diglycidyl ether of bisphenol A having a weight per epoxide between about 600 and about 950;

b) incorporating an effective amount of a cationic photoinitiator as a curing agent, comprising a triphenyl sulfonium compound, into the mixture, and c) processing the resin mixture including the steps of 1) exposing at least a portion of the layer to a source of actinic radiation, 2) subjecting the exposed portion to heat to at least partially cure the exposed material, 3) removing unexposed material, 4) exposing the partially cured mixture to actinic radiation a second time, and 5) heating to fully cure the partially cured mixture to form the dielectric.

9. The process of using a photoimagable polymer capable of forming a film having a glass transition temperature of at least about 140° C., comprising:

a) preparing a resin mixture of a polyfunctional epoxy resin having more than two epoxy and the condensation product of diglycidyl ether of a bisphenol A and an epichlorohydrin, wherein the polyfunctional epoxy comprises between about 30 parts and about 70 parts by weight per 100 parts of the resin mixture, and the condensation product comprises between about 70 parts and about 30 parts by weight per 100 parts of the resin mixture, b) incorporating into the mixture up to 10 PHR of a third epoxy resin capable of improving the flex fatigue life of the polymer without lowering the glass transition temperature below about 140° C., c) incorporating a cationic photoinitiator into the mixture effective to at least partially cure the mixture upon exposure to actinic radiation, d) applying the mixture to an electronic substrate to form a layer thereupon, and e) exposing the at least a portion of the layer to a source of actinic radiation to at least partially cure the polymer.

* * * * *